(12) United States Patent
Chiang

(10) Patent No.: US 7,652,894 B2
(45) Date of Patent: Jan. 26, 2010

(54) CONTACT LEAD

(75) Inventor: Cheng-Lien Chiang, Taipei (TW)

(73) Assignee: Nichepac Technology Inc., Taipei County (TW)

( * ) Notice: Subject to any disclaimer, the term of this patent is extended or adjusted under 35 U.S.C. 154(b) by 0 days.

(21) Appl. No.: 11/679,177

(22) Filed: Feb. 26, 2007

(65) Prior Publication Data

US 2008/0207018 A1 Aug. 28, 2008

(51) Int. Cl.
*H05K 7/10* (2006.01)
(52) U.S. Cl. .................. 361/767; 361/813
(58) Field of Classification Search ......... 439/862; 361/767, 770–774, 813
See application file for complete search history.

(56) References Cited

U.S. PATENT DOCUMENTS

| 5,420,461 | A | * | 5/1995 | Mallik et al. | 257/734 |
| 5,544,412 | A | * | 8/1996 | Romero et al. | 29/832 |
| 6,398,598 | B2 | * | 6/2002 | Masumoto | 439/862 |
| 6,713,854 | B1 | * | 3/2004 | Kledzik et al. | 257/686 |
| 6,843,688 | B2 | * | 1/2005 | Matsunaga et al. | 439/630 |
| 6,867,378 | B2 | * | 3/2005 | Uchida et al. | 174/260 |
| 7,011,555 | B2 | * | 3/2006 | Pan | 439/862 |

* cited by examiner

*Primary Examiner*—Thanh-Tam T Le

(57) ABSTRACT

A contact lead for engaging with an aperture lead of a circuit carrier, including a substrate contact portion electrically connected to a pad on a substrate a chip contact portion extending from the substrate contact portion and forming an angle with the substrate contact portion raising from the substrate. The contact lead chip contact portion may also be of a cylindrical shape vertically extending from the substrate contact portion. The present invention also provides a module including a printed circuit board having a plurality of pad thereon ,the contact lead electrically connected to the pad, an integrated circuit carrier having a plurality of aperture leads, the aperture leads passing through the contact lead and contacting respectively thereof, and a housing structure for housing the module and providing access for the user to assemble the integrated circuit carrier.

23 Claims, 7 Drawing Sheets

CONTACT LEAD

BACKGROUND

1. Field of Invention

The present invention relates to a contact lead. More particularly, the present invention relates to a contact lead for engaging with an aperture lead of an integrated circuit carrier.

2. Description of Related Art

The advancement in electronics products propels the integrated circuits industry to produce chips with smaller size, faster speed, and larger storage memory space. Therefore, products such as memory cards depreciate fast in value due to newer memory chips hitting the market at short time intervals. Memory cards with less memory are less likely to sell when cards with larger memory at a fair price are circulating in the market. The memory card manufacturer will have a hard time selling the outdated products and have no choice but to take a loss for the overstocked products. Furthermore, if the memory card manufacturer introduced a product, which is premature for the consumer market, the manufacturer will also take a loss for the unsold products. For example, if a memory card with a large memory capacity is introduced on the market but does not sell well as expected, the memory will have little use for the immediate future.

Therefore, the disadvantage is that memory cards such as secure digital (SD) cards and multi-media cards (MMC) does not possess upgrade or downgrade capabilities in memory size. This disadvantage leads to wasted products at both the manufacturer end and the consumer end.

Please refer to FIG. 1, an overview of the connection between an integrated circuit chip 102 and the contact leads 104. The connection is a solder connection, wherein the leads 106 of the chip are soldered onto the contact leads 104 of the substrate 108, respectively. The solder connection prevents the chip 104 from being replaced by a different memory chip without de-soldering.

For the forgoing reasons, there is a need for a circuit module such as memory cards, which allows for upgrades and downgrades of integrated circuit chips such as memory chips. The upgrading and downgrading may be done by a detachable structure allowing the memory chips to be detached from the circuit substrate rather than soldered onto the circuit substrate.

SUMMARY

The present invention is directed to a contact lead, that it satisfies this need of having a detachable structure on a circuit module. The contact lead comprises a substrate contact portion and a chip contact portion. The first end of the substrate contact portion is stamped onto the pads of the substrate and the second end is extended onto a tape, which serves as a support for the contact lead. The chip contact portion extending from the second end forms an angle with the substrate contact portion. The angle elevates from the substrate. In another embodiment of the present invention, the contact lead comprises a substrate contact portion and a chip contact portion. The substrate contact portion is electrically connected to the pads of the substrate. The chip contact portion has a cylindrical shape extending vertically from the substrate contact portion. In this embodiment, the contact lead further includes a spring coil looped around the contact lead. The chip contact portion is to be inserted and engaged with an aperture lead of an integrated circuit carrier. The engagement is a detachable engagement.

The detachable structure will allow the integrated circuit chips to be assembled onto the circuit substrate without the solder connection, and detached from the circuit substrate for replacement. The manufacturer may upgrade and downgrade memory cards according to the market demand and not let memory cards with undesirable memory size be wasted. On the consumer end, one may upgrade the memory card to a larger sized memory by replacing the memory chip rather than having to replace the entire memory card.

The memory card may also have multiple memory chips stacked on top of each other as long as the chip contact portion of the contact leads are of an adequate length to be able to securely engage with all the stacked chips.

Furthermore, to accommodate for the replaceable memory chips, a memory card housing is designed to provide access to the memory chips.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 4b is a cross section view along the line AB in FIG. 4a;

DESCRIPTION OF THE PREFERRED EMBODIMENTS

Figure 1:
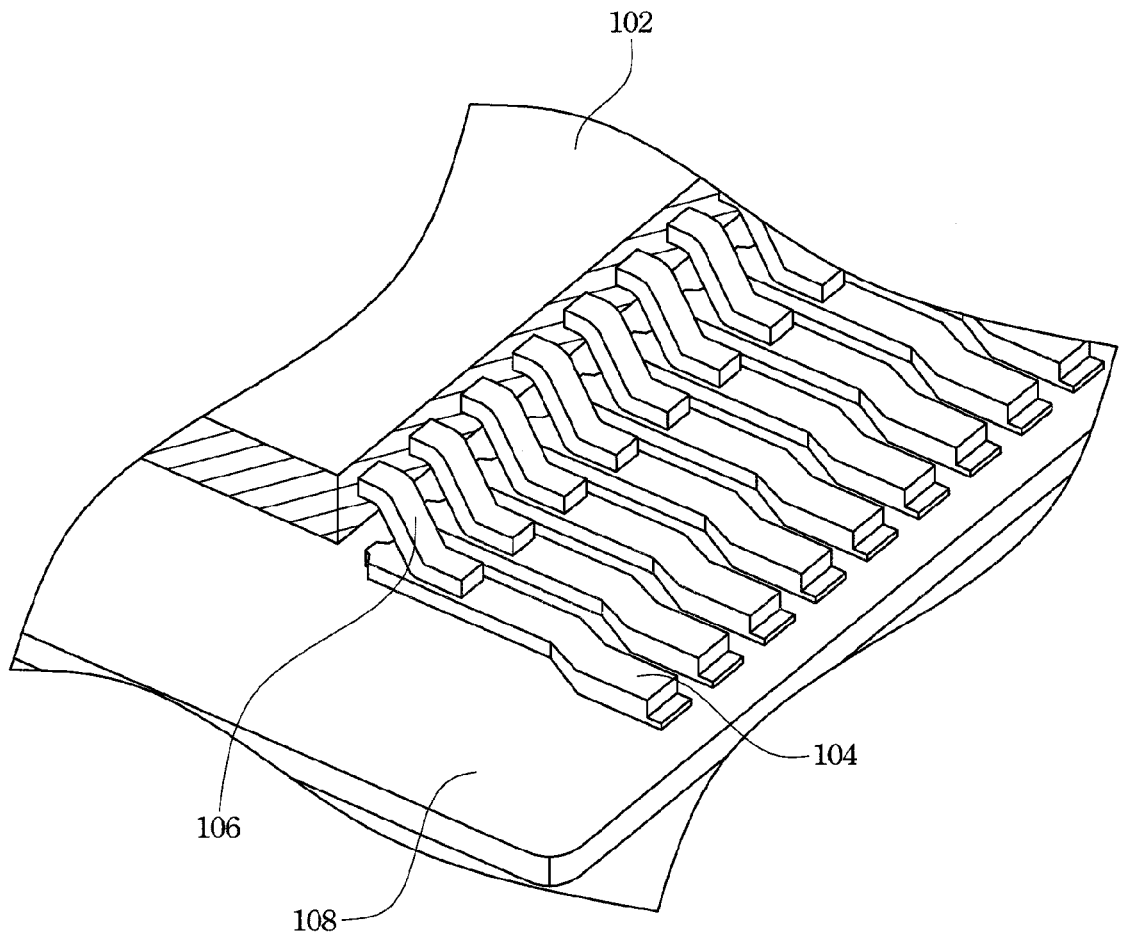
FIG. 1 is an overview of the connection between an integrated circuit chip and the contact leads.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
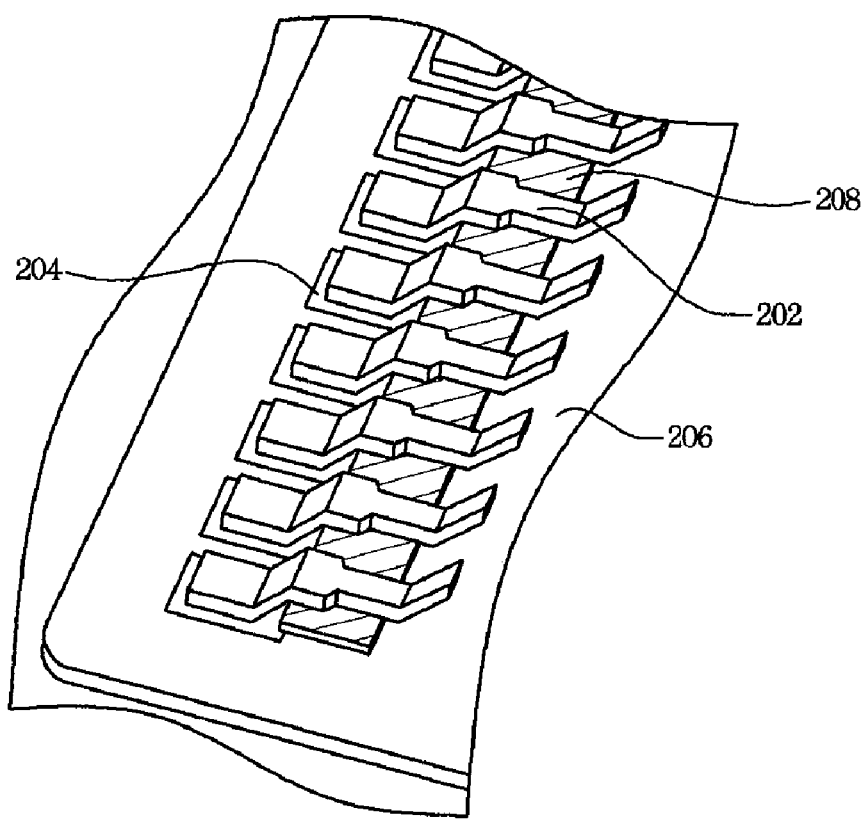
FIG. 2a is an illustration of a row of contact leads connected to a printed circuit board according to a first embodiment of the present invention according to one preferred embodiment of this invention.
Figure 2B:
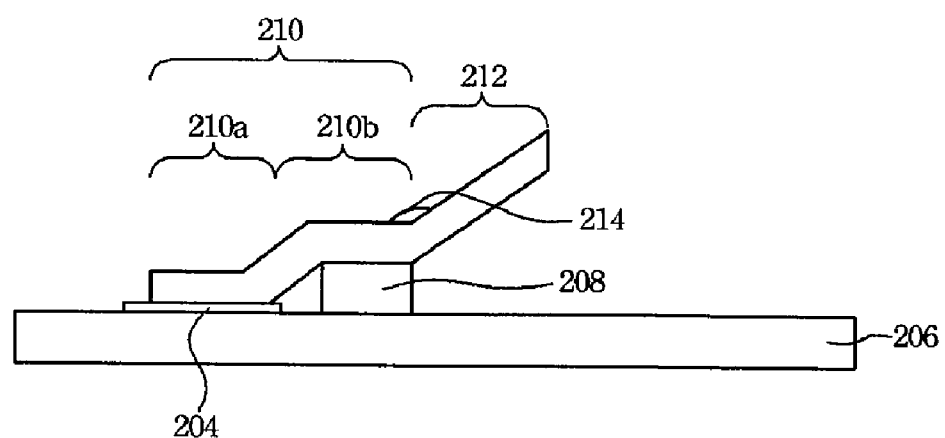
FIG. 2b is a side view of the contact lead according to the first embodiment of the present invention.

Please refer to FIG. 2a, and 2b simultaneously. FIG. 2a illustrating a row of contact leads connected to a printed circuit board according to a first embodiment of the present invention. The contact lead 202 is electrically connected to the pad 204 on the printed circuit board 206. The contact lead 202 is supported by a tape 208. In FIG. 2b, a side view of the contact lead 202 according to the first embodiment of the present invention, the structure of the contact lead is divided into a substrate contact portion 210 and a chip contact portion 212. The substrate contact portion 210 may be further divided into a first end 210a and a second end 210b. The first end 210a is stamped onto the pad 204 and is electrically connected to the pad 204. The second end 210b is extended from the first end onto the tape 208. The chip contact portion 212 is an extension from the second end 210b. The chip contact portion 212 forms an angle 214 with the substrate contact portion 210. The degree of elevation may vary for different applications.

Figure 3A:
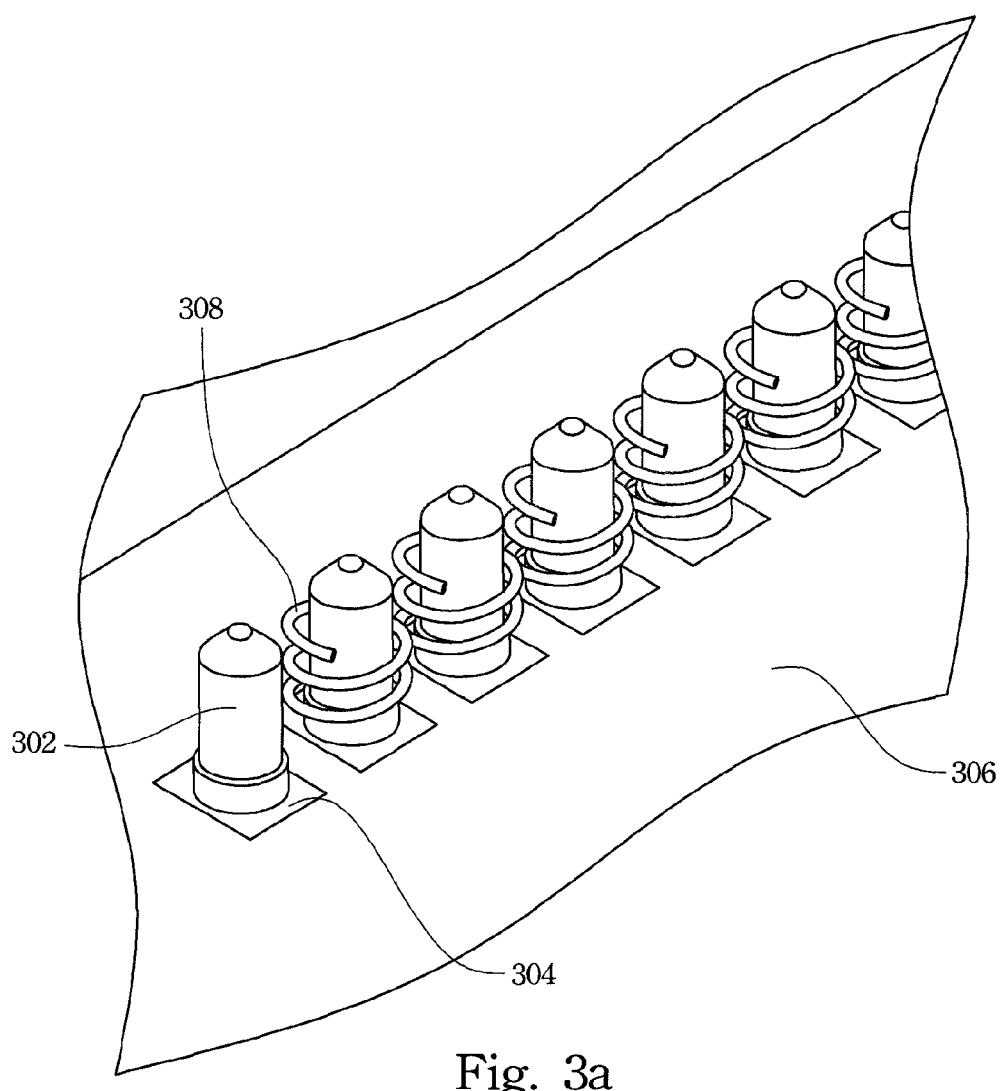
FIG. 3a is an illustration of a row of contact leads connected to a printed circuit board according to a second embodiment of the present invention.
Figure 3B:
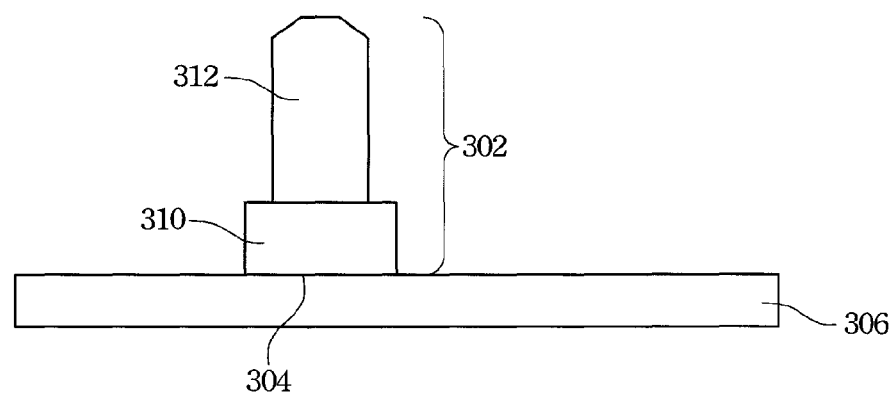
FIG. 3b is a side view of the contact lead 302 according to the second embodiment of the present invention.

Please refer to FIGS. 3a and 3b simultaneously. FIG. 3a illustrating a row of contact leads connected to a printed circuit board according to a second embodiment of the present invention. The contact lead 302 is electrically connected to the pad 304 on the printed circuit board 306. The contact lead 302 also includes a spring coil 308 looped around the contact lead providing support for engaging with the aperture leads. In FIG. 3b, a side view of the contact lead 302 according to the second embodiment of the present invention. The structure of the contact lead 302 is divided into a substrate contact portion 310 and a chip contact portion 312. The substrate contact portion 310 may be soldered onto the pads 304 of the printed circuit board 306. The chip contact portion 312 has a cylindrical shape providing a fitting shape for engaging with the aperture leads. The chip contact portion 312 extends vertically from the substrate contact portion 310.

Figure 4A:
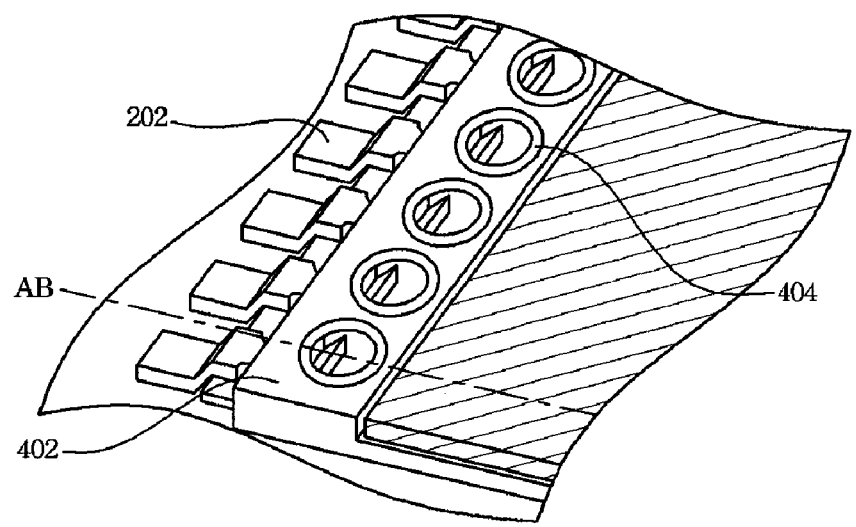
FIG. 4a is an illustration of an integrated circuit carrier engaging with the contact leads of the first embodiment of the present invention.
Figure 4B:
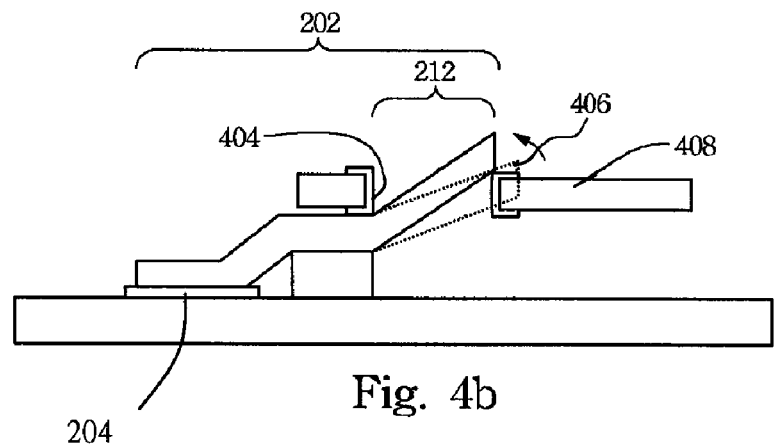
Figure 4C:
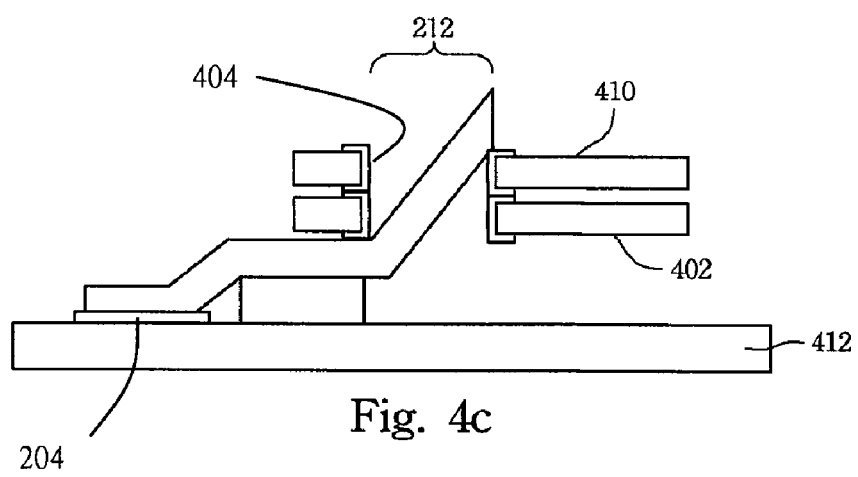
FIG. 4c is a cross section view a cross section view along the line AB in FIG. 3a with an extra integrated circuit carrier.

Please refer to FIGS. 4a, 4b, and 4c simultaneously. FIG. 4a illustrating an integrated circuit carrier 402 engaging with the contact leads 202 of the first embodiment of the present invention. The integrate circuit carrier 402 may be a leadframe packaged integrate circuit, a semiconductor die packaged onto a transfer substrate, or an integrated circuit package connected onto a transfer carrier via a flip-chip method. The integrated circuit carrier 402 has aperture leads 404 which allows the contact leads 202 to be inserted into the aperture leads 404 and establish electrical connection with the aperture leads 404. In FIG. 4b, a cross section view along the line AB in FIG. 4a, the contact lead 202 engages with the aperture lead 404. The structure of the aperture leads 404 forces the chip contact portion 212 to be bended in the direction of the arrow 306 from its previous position 408. The bending of the chip contact portion 212 provides a force pressing the chip contact portion 212 against the aperture lead 404. The bending force therefore provides a secure engagement between the contact lead 202 and the aperture lead 404. In FIG. 4c, a cross section view a cross section view along the line AB in FIG. 4a with an extra integrated circuit carrier 410 stacked on top of the integrated circuit carrier 302. The stacking structure allows the integrated circuit carriers to be electrically connected with each other and also with the substrate 412. The stacking structure also provides the flexibility of stacking multiple integrated circuit carriers to adjust the memory size of the memory card. In order to stack multiple integrated circuit carriers, the chip contact portion 212 will need to be extended in length to securely engage with all the stacked integrated circuit carriers.

Figure 5A:
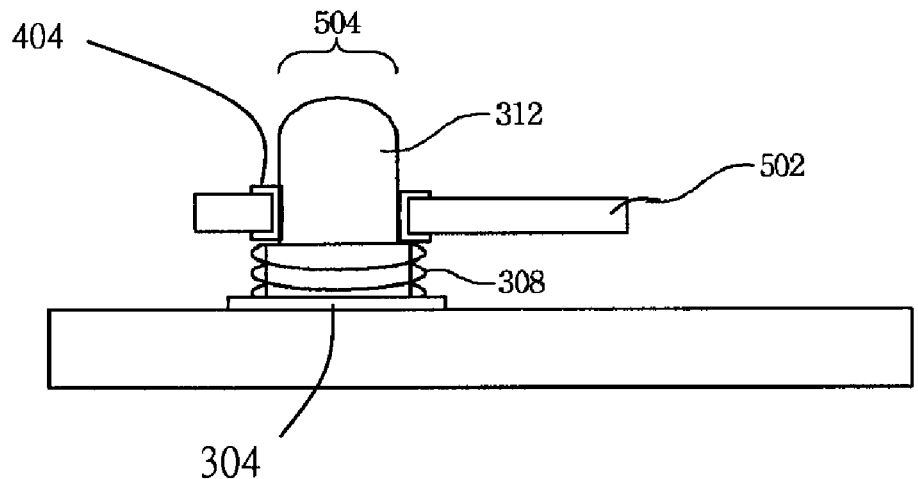
FIG. 5a is a cross section view of an integrated circuit carrier engaging with the contact leads of the second embodiment of the present invention.
Figure 5B:
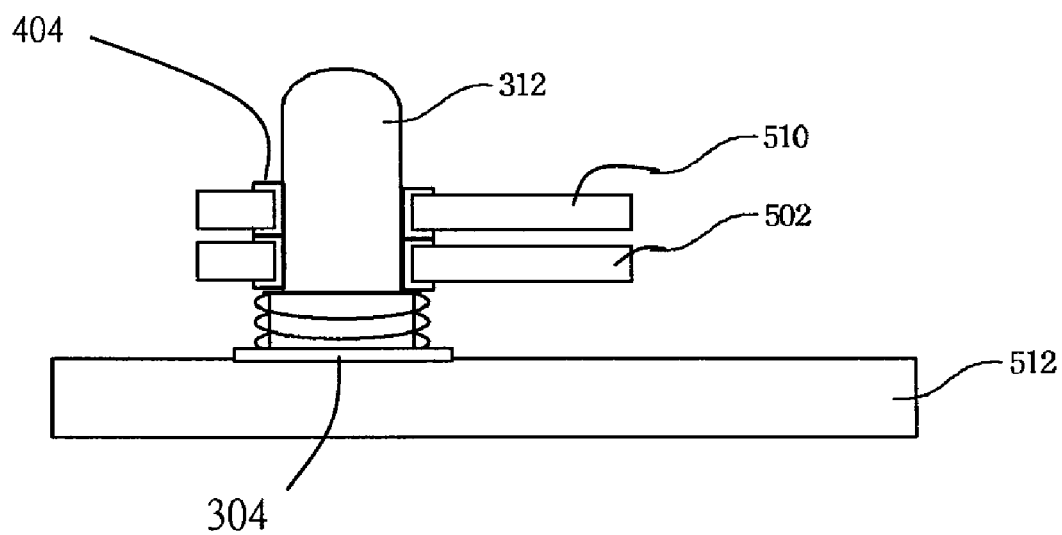
FIG. 5b is a cross section view of an integrated circuit carrier engaging with the contact leads of the second embodiment of the present invention with an extra integrated circuit carrier.

Please refer to FIG. 5a, and 5b simultaneously. FIG. 5a illustrating an a cross section view of an integrated circuit carrier 502 engaging with the contact leads 302 of the second embodiment of the present invention. The integrate circuit carrier 502 may be a leadframe packaged integrate circuit, a semiconductor die packaged onto a transfer substrate, or an integrated circuit package connected onto a transfer carrier via a flip-chip method. The integrated circuit carrier 502 has aperture leads 504 which allows the contact leads 302 to be inserted into the aperture leads 504 and establish electrical connection with the aperture leads 504. The inner surface of the aperture leads 504 makes contact with the outer surface of the chip contact portion 312. The friction force between the surfaces may induce a detachable grip between the aperture leads 504 and the chip contact portion 312. Furthermore, the spring coil 308 supports the integrated circuit carrier 502 and may force the integrated circuit carrier 502 against the a clamping structure (not shown), such as a cap to fix the integrated circuit carrier 502. In FIG. 5b, a cross section view of an integrated circuit carrier 502 engaging with the contact leads 302 of the second embodiment of the present invention with an extra integrated circuit carrier 510 stacked on top of the integrated circuit carrier 502. The stacking structure allows the integrated circuit carriers to be electrically connected with each other and also with the substrate 512. The stacking structure also provides the flexibility of stacking multiple integrated circuit carriers to adjust the memory size of the memory card. In order to stack multiple integrated circuit carriers, the chip contact portion 312 will need to be extended in length to securely engage with all the stacked integrated circuit carriers.

Figure 6:
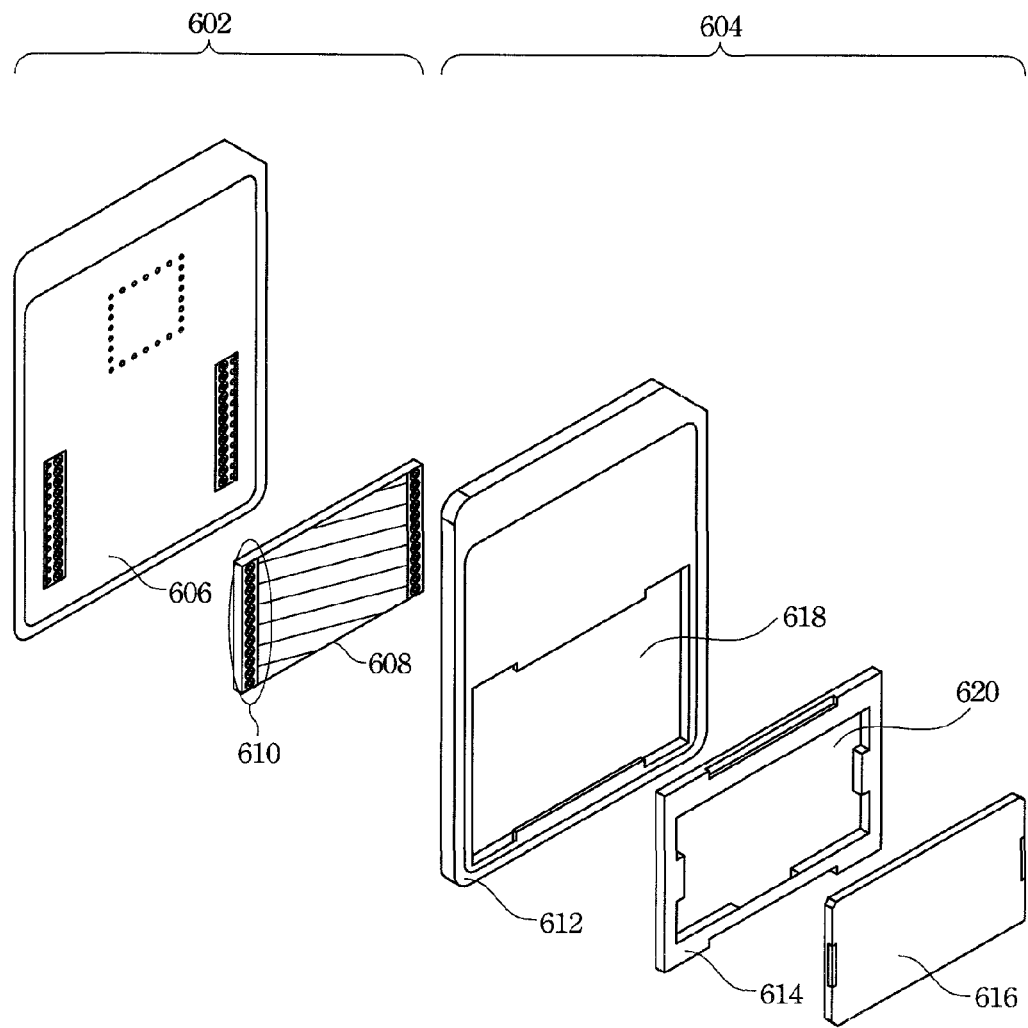
FIG. 6 is an exploded view of a memory card according to the second embodiment of the present invention.

Please refer to FIG. 6, an exploded view of a module according to the third embodiment of the present invention. The module may be a memory card such as a SD card or a MMC. The memory card 600 includes a detachable module 602, and a housing structure 604. The detachable module 602 includes a printed circuit board 606 having the contact leads of either the first embodiment, the second embodiment or the combination thereon, a integrated circuit carrier 608 with aperture leads 610 is electrically connected to the contact leads via the connection described above. There may be more than one integrated circuit carrier electrically connected to the contact leads. Multiple integrated circuit carriers may be stacked on top of each other and be kept in the same housing structure 604. The housing structure 604 includes a card housing 612, a socket housing 614, and a clamp housing 616. The card housing 612 engages with the printed circuit board 606 and shields the surface of the printed circuit board 606, which has the contact leads of either the first embodiment, the second embodiment or the combination thereon. The card housing 612 has an opening 618 located on top of the integrated circuit carrier 608. The socket housing 614 is assembled inside the opening 618 and engages securely with the opening 618. The socket housing 614 also has an opening 620 located on top of the integrated circuit carrier 608 exposing the integrated circuit carrier 608 thus providing the channel for integrated circuit carrier 608 attachment and detachment. Lastly, the clamping structure 616 acts as a cap to seal the enclosure of the memory card. The clamping structure may click onto the sides of the opening 620 and be removed when replacing the integrated circuit carrier 608.

Figure 7A:
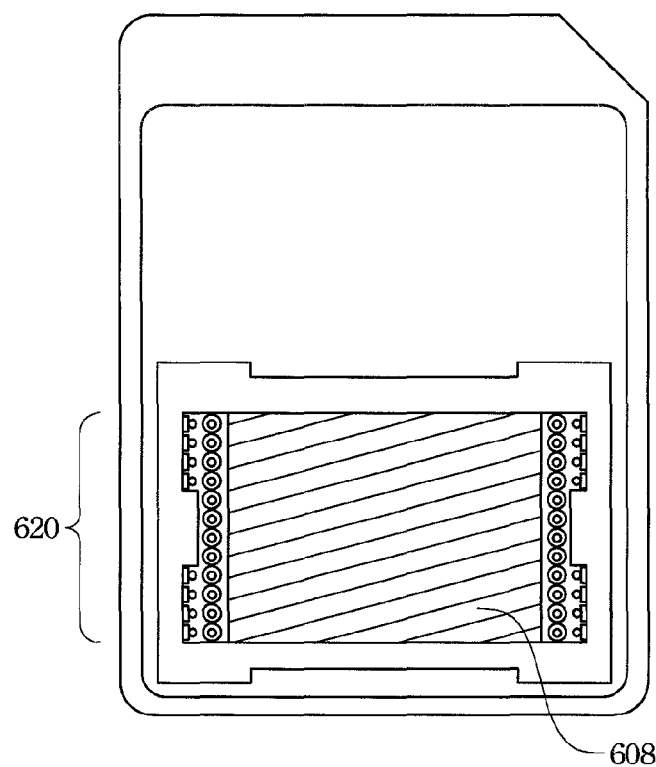
FIG. 7a is a top view of the assembled memory card without the clamping structure.
Figure 7B:
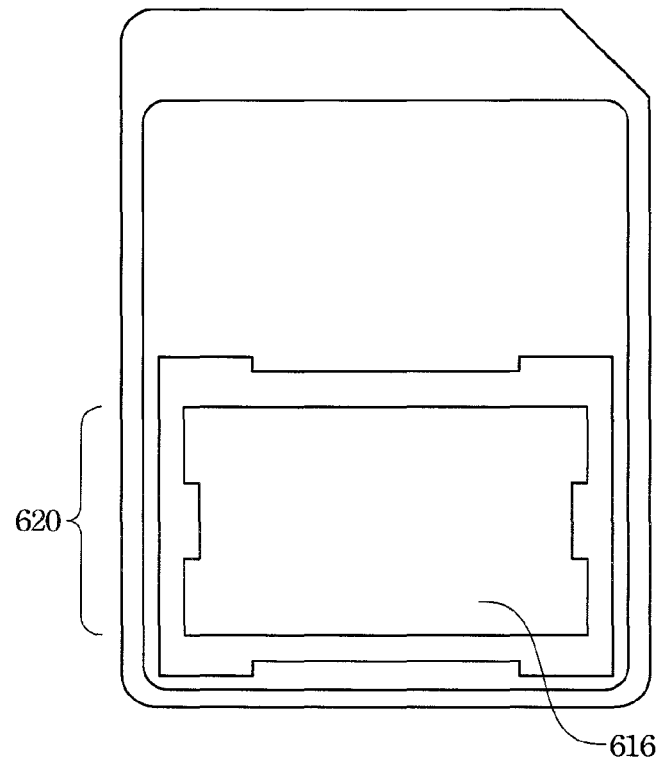
FIG. 7b is a top view of the assembled memory card with the clamping structure clipped onto the opening.

Please refer to FIG. 7a, and FIG. 7b simultaneously. FIG. 7a is a top view of the assembled memory card 600 without the clamping structure 616. The opening 620 is of a suitable size to ensure the integrated circuit carrier 408 may be attached and detached with relative ease. FIG. 7b is a top view of the assembled memory card 600 with the clamping structure 616 clipped onto the opening 620. By removing the clamping structure, one may replace the memory chip on the printed circuit board with a different memory size chip, and/or stack multiple chips onto the printed circuit board.

The present invention is a contact lead for engaging with an aperture lead of an integrated circuit carrier. The contact lead provides a detachable connection between the printed circuit board and the integrate circuit carrier. The detachable connection may be applied to memory cards such as SD cards and MMC. Therefore when one desires to upgrade or downgrade the memory size of a memory card, it is not necessary for one to discard the entire memory but may choose to replace the memory chips on the memory card.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A module, comprising:
    a substrate having a plurality of first pads thereon;
    a plurality of contact leads, each contact lead comprising:
        a substrate contact portion electrically connected to one of the first pads on the substrate; and
        a chip contact portion extending from the substrate contact portion and protruding from the substrate;
    an integrated circuit carrier having, on opposite sides thereof, a plurality of aperture leads, the chip contact portions passing through and being in electrical contact with the aperture leads, respectively, the integrated circuit carrier comprising:
        a transfer carrier; and
        an integrated circuit package located on the transfer carrier; and
    a housing structure for housing the substrate and providing access for a user to assemble the integrated circuit carrier.

2. The module of claim 1, wherein each of the chip contact portions forms an angle with the respective substrate contact portion elevating from the substrate.

3. The module of claim 1, wherein the contact between each of the aperture leads and a respective one of the contact leads is a detachable connection.

4. The module of claim 1, wherein the chip contact portions are pressed against the respective aperture leads by a bending force of the chip contact portions for providing a secure grip to the integrated circuit carrier.

5. The module of claim 1, wherein each of the chip contact portions has a surface in electrical contact with an inner surface of a respective one of the aperture leads.

6. The module of claim 1, wherein the module is a secure digital (SD) card.

7. The module of claim 1, wherein the module is a multi media card (MMC).

8. A module, comprising:
    a substrate having a plurality of first pads thereon;
    a plurality of contact leads, each contact lead comprising:
        a substrate contact portion electrically connected to one of the first pads on the substrate; and
        a chip contact portion extending from the substrate contact portion and protruding from the substrate;
    an integrated circuit carrier having, on opposite sides thereof, a plurality of aperture leads, the chip contact portions passing through and being in electrical contact with the aperture leads, respectively, the integrated circuit carrier comprising:
        a transfer carrier; and
        a bare die located on the transfer carrier, and packaged by an encapsulation layer; and
    a housing structure for housing the substrate and providing access for a user to assemble the integrated circuit carrier.

9. The module of claim 8, wherein each of the chip contact portions forms an angle with the respective substrate contact portion elevating from the substrate.

10. The module of claim 8, wherein the contact between each of the aperture leads and a respective one of the contact leads is a detachable connection.

11. The module of claim 8, wherein the chip contact portions are pressed against the respective aperture leads by a bending force of the chip contact portions for providing a secure grip to the integrated circuit carrier.

12. The module of claim 8, wherein each of the chip contact portions has a surface in electrical contact with an inner surface of a respective one of the aperture leads.

13. The module of claim 8, wherein the module is a secure digital (SD) card.

14. The module of claim 8, wherein the module is a multi media card (MMC).

15. A module, comprising:
    a substrate having a plurality of first pads thereon;
    a plurality of contact leads, each contact lead comprising:
        a substrate contact portion electrically connected to one of the first pads on the substrate; and
        a chip contact portion extending from the substrate contact portion and protruding from the substrate;
    an integrated circuit carrier having a plurality of aperture leads, the chip contact portions passing through and being in electrical contact with the aperture leads, respectively; and
    a housing structure for housing the substrate and providing access for a user to assemble the integrated circuit carrier, the housing structure comprising:
        a card housing structure engaging with the substrate and having a first opening;
        a socket housing structure engaging with all sides of the first opening, having a second opening exposing the integrated circuit carrier; and
        a clamping structure capping the second opening.

16. The module of claim 15, wherein each of the chip contact portions forms an angle with the respective substrate contact portion elevating from the substrate.

17. The module of claim 15, wherein the contact between each of the aperture leads and a respective one of the contact leads is a detachable connection.

18. The module of claim 15, wherein the chip contact portions are pressed against the respective aperture leads by a bending force of the chip contact portions for providing a secure grip to the integrated circuit carrier.

19. The module of claim 15, wherein each of the chip contact portions has a surface in electrical contact with an inner surface of a respective one of the aperture leads.

20. The module of claim 15, wherein the integrated circuit carrier is a leadframe packaged chip.

21. The module of claim 15, wherein the module is a secure digital (SD) card.

22. The module of claim 15, wherein the module is a multi media card (MMC).

23. A module, comprising:

a substrate having a plurality of first pads thereon;

a plurality of contact leads, each contact lead comprising:

a substrate contact portion electrically connected to one of the first pads on the substrate; and a chip contact portion extending from the substrate contact portion and protruding from the substrate;

a first integrated circuit carrier having a plurality of first aperture leads;

a second integrated circuit carrier stacked on the first integrated circuit carrier and having a plurality of second aperture leads; and a housing structure for housing the substrate and providing access for assembly of the integrated circuit carriers;

wherein each of the chip contact portions passes through one of the first aperture leads and also through one of the second aperture leads, and electrically contacts the first and second aperture leads, respectively.

* * * * *